United States Patent
Akou

(10) Patent No.: US 10,269,683 B2
(45) Date of Patent: Apr. 23, 2019

(54) SEMICONDUCTOR DEVICE HAVING A THROUGH ELECTRODE AND METHOD OF MANUFACTURING THE SAME

(71) Applicant: Toshiba Memory Corporation, Minato-ku (JP)

(72) Inventor: Masayuki Akou, Yokohama (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 8 days.

(21) Appl. No.: 15/378,571

(22) Filed: Dec. 14, 2016

(65) Prior Publication Data
US 2017/0243809 A1    Aug. 24, 2017

Related U.S. Application Data

(60) Provisional application No. 62/299,204, filed on Feb. 24, 2016.

(51) Int. Cl.
*H01L 23/48* (2006.01)
*H01L 27/146* (2006.01)
*H01L 21/768* (2006.01)

(52) U.S. Cl.
CPC ...... *H01L 23/481* (2013.01); *H01L 21/76898* (2013.01); *H01L 27/14636* (2013.01)

(58) Field of Classification Search
CPC ............ H01L 23/481; H01L 21/76898; H01L 27/14636
See application file for complete search history.

(56) References Cited

U.S. PATENT DOCUMENTS

| 8,907,493 B2 * | 12/2014 | Uchida ................. H01L 23/481 257/751 |
| 2014/0015139 A1 * | 1/2014 | Watanabe ............. H01L 23/538 257/758 |
| 2014/0054774 A1 * | 2/2014 | Uchida ............. H01L 21/76898 257/751 |
| 2018/0053797 A1 * | 2/2018 | Lee .................. H01L 21/76898 |

FOREIGN PATENT DOCUMENTS

| JP | 2011-3645 | 1/2011 |
| JP | 2014-22396 | 2/2014 |
| JP | 2015-153930 | 8/2015 |

* cited by examiner

*Primary Examiner* — Mohsen Ahmadi
*Assistant Examiner* — Scott E Bauman
(74) *Attorney, Agent, or Firm* — Oblon, McClelland, Maier & Neustadt, L.L.P.

(57) ABSTRACT

A semiconductor device according to an embodiment includes a semiconductor layer having a first plane and a second plane, an insulating layer provided in the first plane side of the semiconductor layer, a metal layer provided on or above the insulating layer, and a through electrode penetrating through the semiconductor layer and in contact with the metal layer. When a width of the through electrode in the first plane is a first width, a width of the through electrode in an intermediate plane between the first plane and the second plane is a second width, and a width of the metal layer is a third width, a first difference between the second width and the first width is larger than a second difference between the third width and the first width.

7 Claims, 8 Drawing Sheets

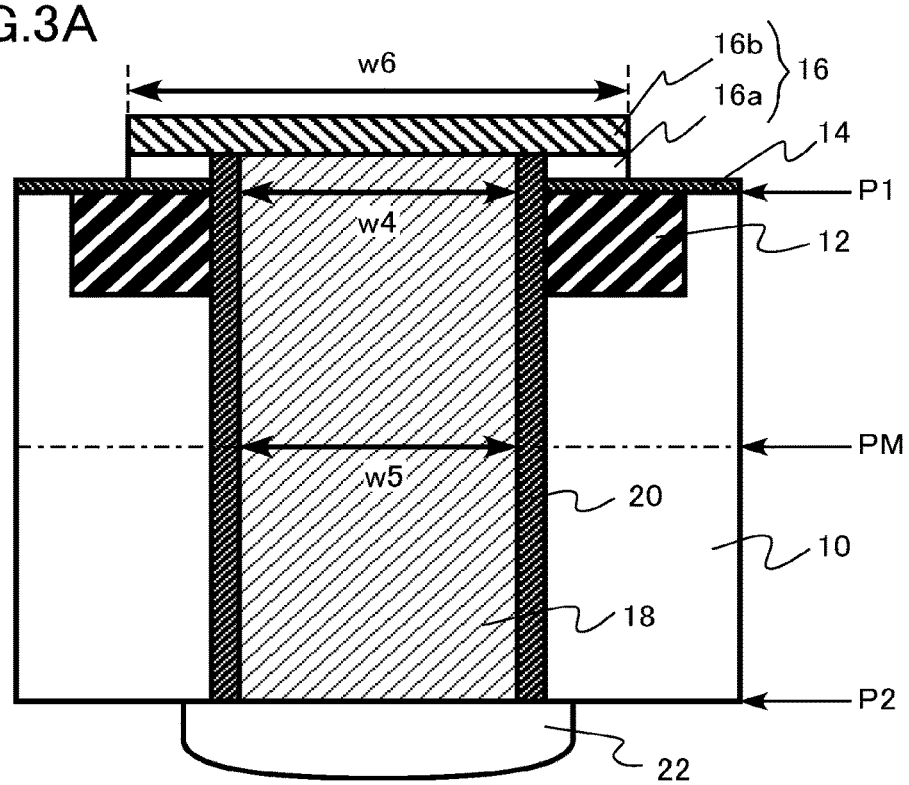
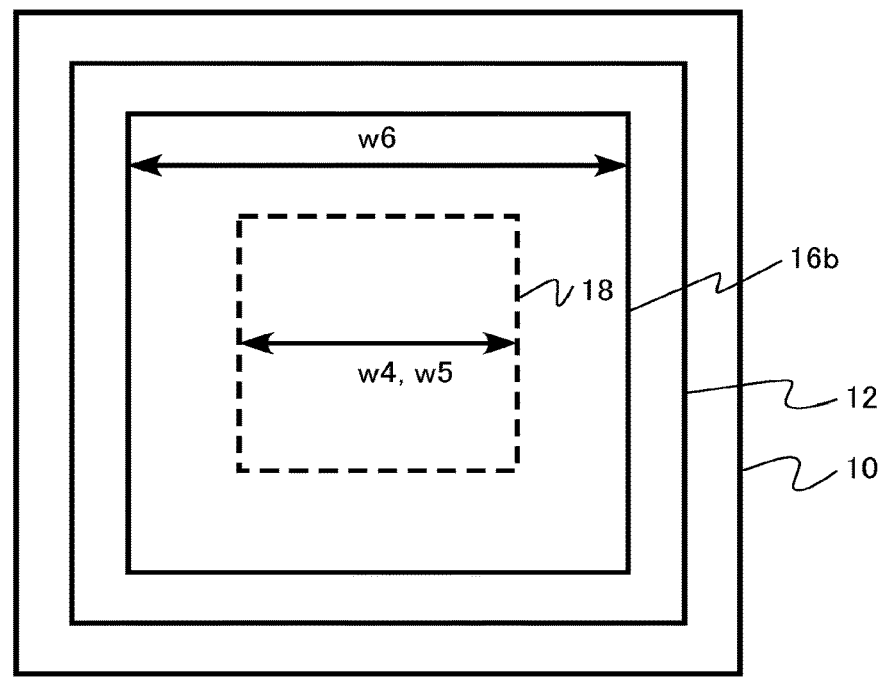

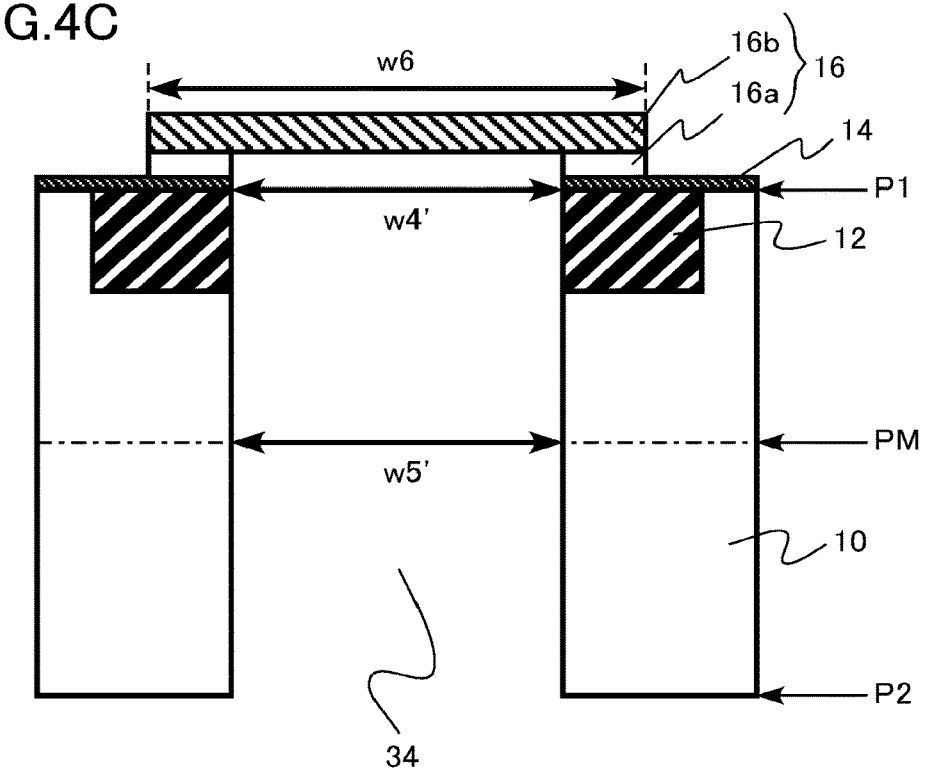
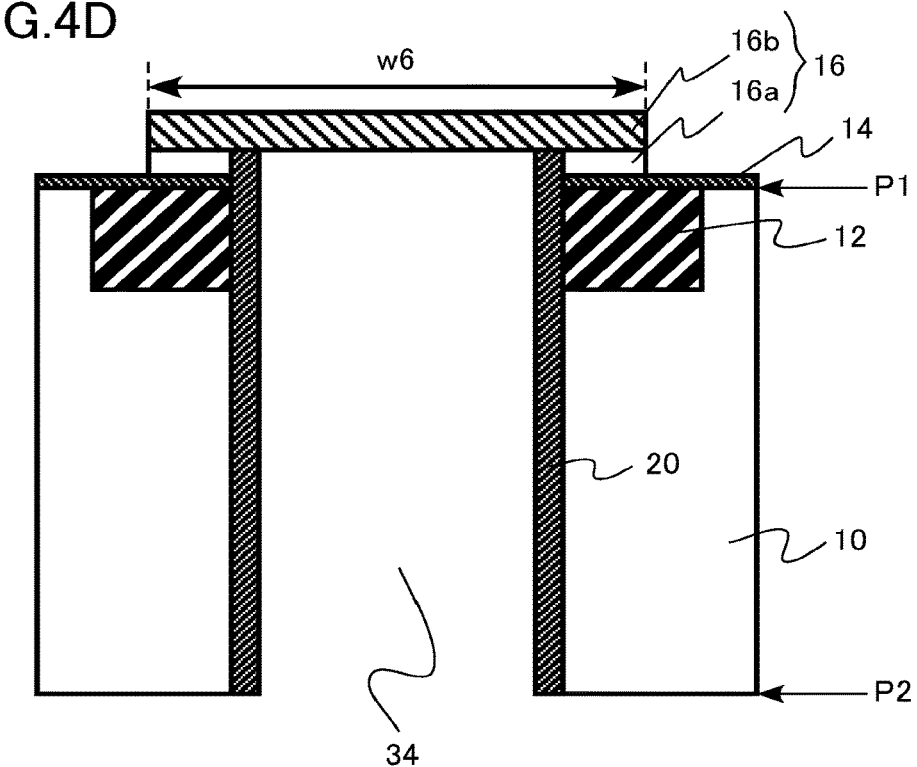

SEMICONDUCTOR DEVICE HAVING A THROUGH ELECTRODE AND METHOD OF MANUFACTURING THE SAME

CROSS-REFERENCE TO RELATED APPLICATION

This application is based upon and claims the benefit of priority from U.S. Provisional Application No. 62/299,204, filed on Feb. 24, 2016, the entire contents of which are incorporated herein by reference.

FIELD

Embodiments of the invention relate to a semiconductor device and a method of manufacturing the same.

BACKGROUND

A through silicon via (TSV) is used to electrically connect semiconductor devices which are stacked. The use of the TSV makes it possible to reduce capacitance and resistance required to connect the semiconductor devices. Therefore, it is possible to reduce the power consumption of the stacked semiconductor devices and to improve an operation speed.

BRIEF DESCRIPTION OF THE DRAWINGS

FIGS. 3A and 3B are diagrams schematically illustrating a semiconductor device according to a comparative example;

FIGS. 4A, 4B, 4C, and 4D are cross-sectional views schematically illustrating the semiconductor device that is being manufactured by a manufacturing method according to the comparative example.

DETAILED DESCRIPTION

Figure 1A:
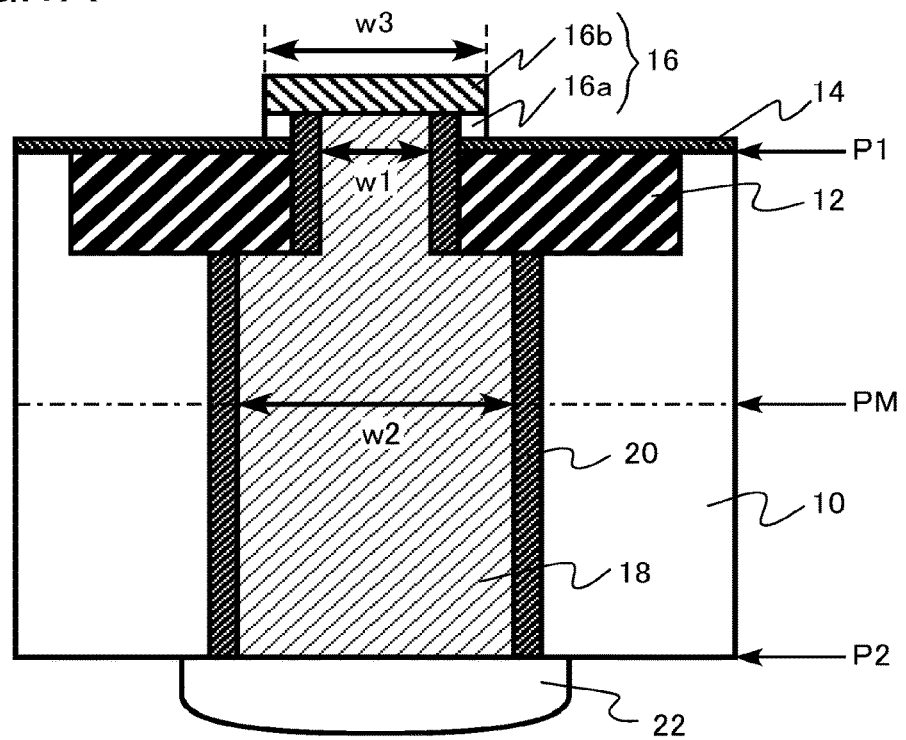
FIGS. 1A and 1B are diagrams schematically illustrating a semiconductor device according to an embodiment.

Hereinafter, embodiments will be described with reference to the drawings. In the embodiments, the same or similar members are denoted by the same reference numerals.

A semiconductor device according to an embodiment includes a semiconductor layer having a first plane and a second plane; an insulating layer provided in the first plane side of the semiconductor layer; a metal layer provided on or above the insulating layer; and a through electrode penetrating through the semiconductor layer, the through electrode being in contact with the metal layer, wherein, when a width of the through electrode in the first plane is a first width, a width of the through electrode in an intermediate plane between the first plane and the second plane is a second width, and a width of the metal layer is a third width, a first difference between the second width and the first width is larger than a second difference between the third width and the first width.

Figure 1B:
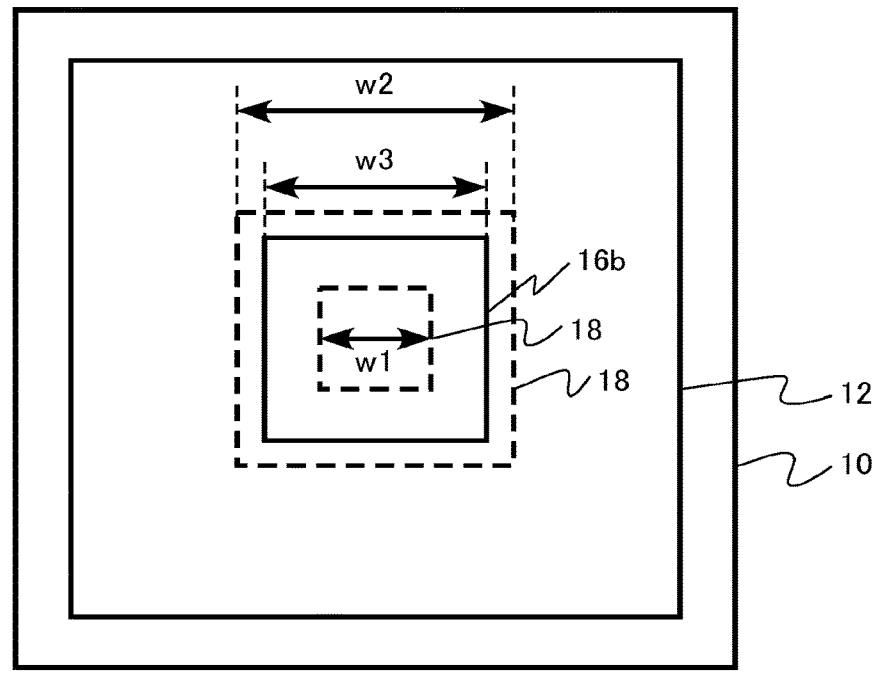

FIGS. 1A and 1B are diagrams schematically illustrating a semiconductor device according to an embodiment. FIG. 1A is a cross-sectional view and FIG. 1B is a top view. The semiconductor device according to the embodiment is a NAND type non-volatile semiconductor memory including a TSV.

FIGS. 1A and 1B are diagrams illustrating a TSV portion of the non-volatile semiconductor memory. The semiconductor device according to the embodiment includes, for example, a memory cell array and a peripheral circuit (not illustrated).

The semiconductor device according to the embodiment includes a semiconductor layer 10, a buried insulating layer (insulating layer) 12, a gate insulating film 14, a gate electrode 16, a through electrode 18, a sidewall insulating film (insulating film) 20, and a backside bump 22. The gate electrode 16 has a stacked structure of a polysilicon layer 16a and a metal layer 16b.

The semiconductor layer 10 has a first plane (P1 in FIG. 1A) and a second plane (P2 in FIG. 1A). The first plane is opposite to the second plane.

A plane between the first plane and the second plane is defined as an intermediate plane (PM in FIG. 1A). The intermediate plane is parallel to the first plane and the second plane. The intermediate plane is equidistant from the first plane and the second plane.

The thickness of the semiconductor layer 10 is, for example, equal to or larger than 30 μm and equal to or less than 50 μm. The semiconductor layer 10 is made of, for example, silicon.

The buried insulating layer (insulating layer) 12 is provided in the semiconductor layer 10. The buried insulating layer 12 is provided on the first plane side of the semiconductor layer 10. For example, the buried insulating layer (insulating layer) 12 functions as an device separation region in the memory cell array or the peripheral circuit (not illustrated).

The thickness of the buried insulating layer 12 is, for example, equal to or larger than 200 nm and equal to or less than 500 nm. The buried insulating layer 12 is made of, for example, silicon oxide.

The gate insulating film 14 is provided on the semiconductor layer 10 and the buried insulating layer 12. For example, the gate insulating film 14 functions as a gate insulating film of a field effect transistor in the memory cell array or the peripheral circuit (not illustrated). The gate insulating film 14 is made of, for example, silicon oxide.

The gate electrode 16 is provided on the gate insulating film 14. The gate electrode 16 has the stacked structure of the polysilicon layer 16a and the metal layer 16b.

The gate electrode 16 functions as, for example, a gate electrode of a field effect transistor in the memory cell array or the peripheral circuit (not illustrated). The metal layer 16b functions as an etching stopper when an opening portion for forming the through electrode 18 is etched.

The end of the metal layer 16b is disposed above the buried insulating layer 12.

The through electrode 18 penetrates through the semiconductor layer 10 and the buried insulating layer 12 and comes into contact with the metal layer 16b. The through electrode 18 is surrounded by the semiconductor layer 10 and the buried insulating layer 12. The width of the through electrode 18 surrounded by the semiconductor layer 10 is larger than the width of the through electrode 18 surrounded by the buried insulating layer 12.

The through electrode 18 is a metal electrode. The through electrode 18 has, for example, a stacked structure of a barrier metal layer and a buried metal layer. The barrier metal layer is made of, for example, titanium nitride. The buried metal layer is made of, for example, nickel.

The sidewall insulating film 20 is provided between the through electrode 18 and the semiconductor layer 10. The sidewall insulating film 20 electrically separates the through electrode 18 from the semiconductor layer 10. The sidewall insulating film 20 is made of, for example, silicon oxide.

The backside bump 22 is provided on the second plane side of the semiconductor layer 10. The backside bump 22 is provided so as to come into contact with the through electrode 18. When the non-volatile semiconductor memories according to the embodiment are stacked, the backside bump 22 functions as a member for electrically and physically connecting the non-volatile semiconductor memories.

The backside bump 22 is made of, for example, tin alloy. For example, an insulating film (not illustrated) is provided between the backside bump 22 and the semiconductor layer 10.

The width of the through electrode 18 in the first plane is defined as a first width (w1 in FIG. 1A), the width of the through electrode 18 in the intermediate plane is defined as a second width (w2 in FIG. 1A), and the width of the metal layer 16b is defined as a third width (w3 in FIG. 1A). A first difference between the second width w2 and the first width w1 is larger than a second difference between the third width w3 and the first width w1. In other words, in the semiconductor device according to the embodiment, w2−w1>w3−w1 is satisfied.

In the semiconductor device according to the embodiment, the second width w2 may be larger than the third width w3.

For example, the first width w1 of the through electrode 18 is equal to or larger than 5 μm and is equal to or less than 10 μm. For example, the second width w2 of the through electrode 18 is equal to or larger than 8 μm and is equal to or less than 15 μm. For example, the third width w3 of the metal layer 16b (gate electrode 16) is equal to or larger than 5 μm and is equal to or less than 11 μm.

Next, a method of manufacturing the semiconductor device according to the embodiment will be described. In the method of manufacturing the semiconductor device according to the embodiment, a groove and a protrusion with the first width are formed in the first plane of the semiconductor layer having the first plane and the second plane. The groove is buried with the insulating layer and the metal layer is formed on the protrusion. An opening portion which extends from the second plane to the metal layer through the semiconductor layer and has the second width larger than the first width in the intermediate plane between the first plane and the second plane is formed. The opening portion is filled with metal to form the buried through electrode.

FIGS. 2A, 2B, 2C, 2D, 2E, and 2F are cross-sectional views schematically illustrating the semiconductor device which is being manufactured by the manufacturing method according to the embodiment.

Figure 2A:
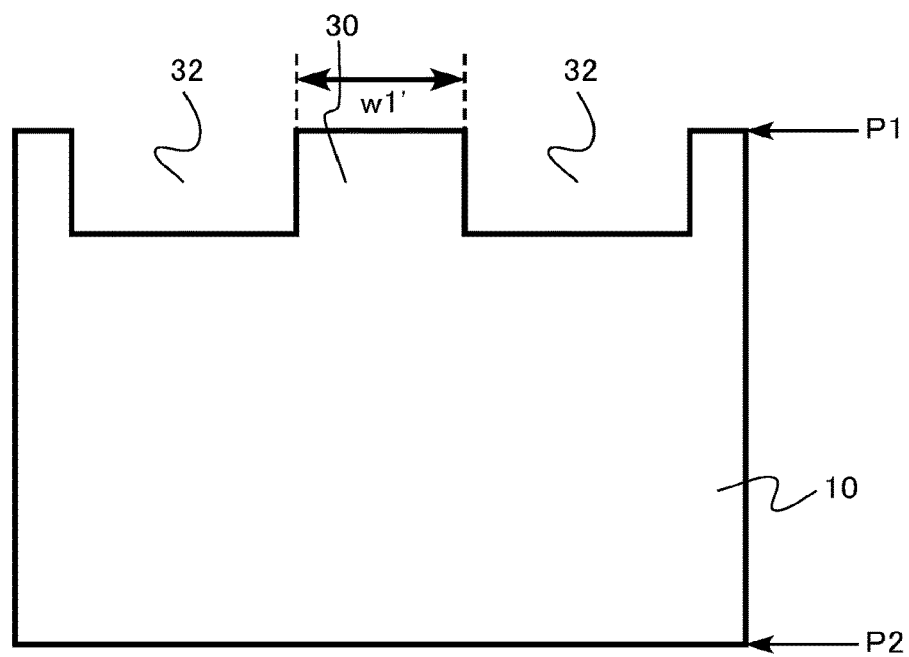
FIGS. 2A, 2B, 2C, 2D, 2E, and 2F are cross-sectional views schematically illustrating the semiconductor device that is being manufactured by a manufacturing method according to the embodiment.

First, a protrusion 30 and a groove 32 are formed in the first plane of the semiconductor layer 10 having the first plane and the second plane by, for example, a known lithography method and a known dry etching method (FIG. 2A). The width of the protrusion 30 is a first width (w1' in FIG. 2A).

Figure 2B:
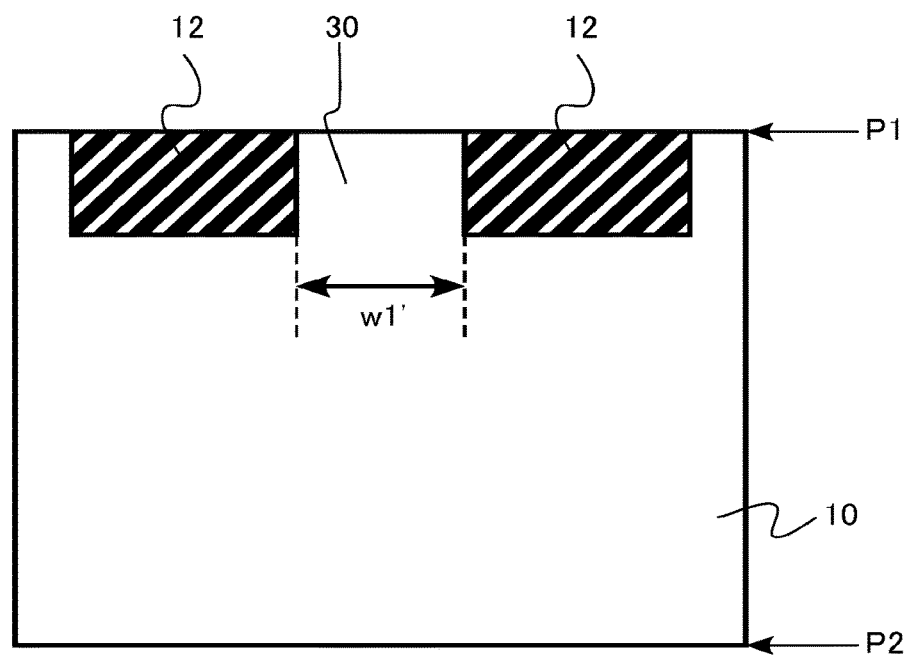

Then, the groove 32 is filled with an insulating material by, for example, a known vapor deposition method and a known chemical mechanical polishing (CMP) method. In this way, the buried insulating layer (insulating layer) 12 is formed (FIG. 2B).

Figure 2C:
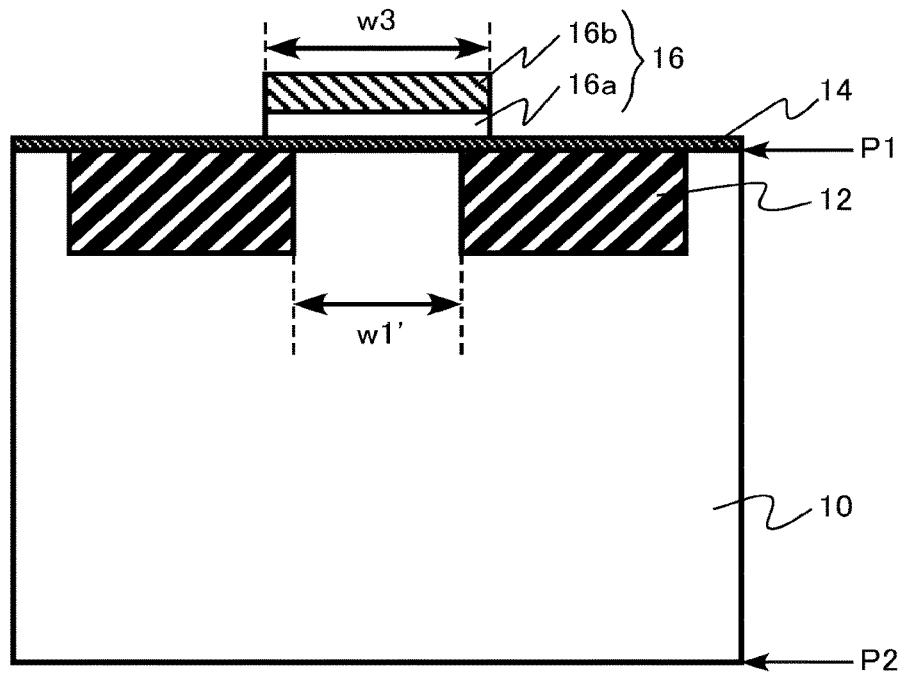

Then, the gate insulating film 14 and the gate electrode 16 are formed on the protrusion 30 by, for example, a known vapor deposition method, a known lithography method, and a known dry etching method (FIG. 2C). The gate electrode 16 has a stacked structure of the polysilicon layer 16a and the metal layer 16b.

When the pattern of the gate electrode 16 is formed by a lithography method, the pattern of the gate electrode 16 is aligned with the pattern of the protrusion 30 (or the buried insulating layer 12) formed on the semiconductor layer 10.

Then, for example, a multi-layer wiring layer and a pad electrode (not illustrated) are formed on the gate electrode 16. Then, for example, backside polishing is performed for the second plane of the semiconductor layer 10 to reduce the thickness of the semiconductor layer 10.

Figure 2D:
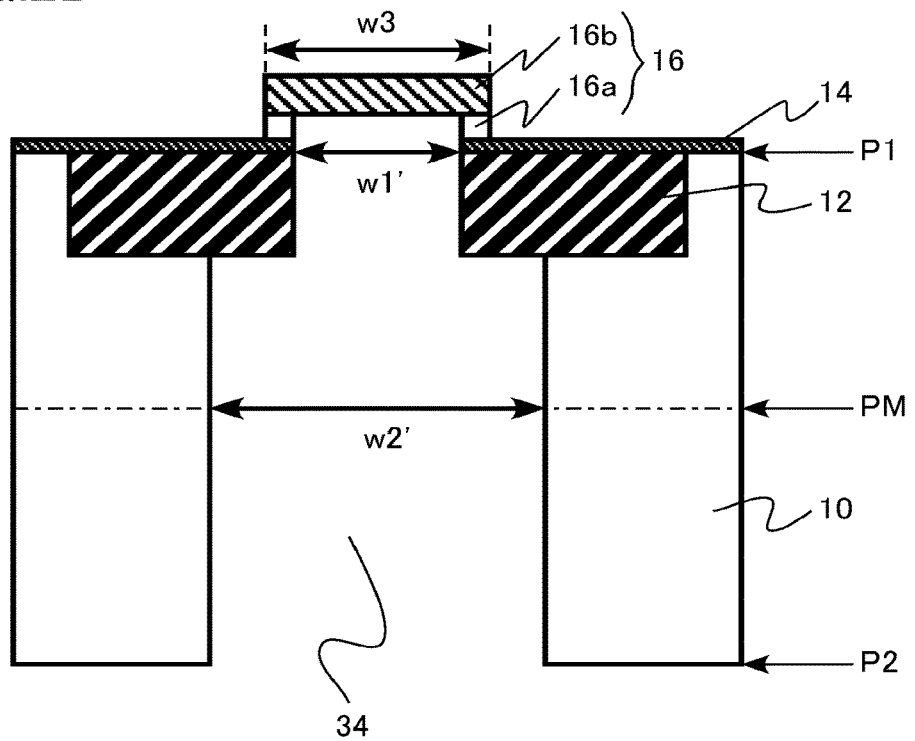

Then, an opening portion 34 is formed by, for example, a known lithography method and a known dry etching method (FIG. 2D). The dry etching method is, for example, a reactive ion etching (RIE) method.

When the pattern of the opening portion 34 is formed by the lithography method, the pattern of the opening portion 34 is aligned with the pattern of the protrusion 30 (or the buried insulating layer 12) formed on the semiconductor layer 10. The pattern of the opening portion 34 is formed such that the side surface of the opening portion 34 overlaps the buried insulating layer 12.

The opening portion 34 is formed from the second plane of the semiconductor layer 10. The opening portion 34 extends to the metal layer 16b through the semiconductor layer 10, the gate insulating film 14, and the polysilicon layer 16a. The metal layer 16b functions as an etching stopper when the opening portion 34 is formed.

The width of the opening portion 34 in the intermediate plane is defined as a second width (w2' in FIG. 2D). The second width w2' is larger than the first width w1' of the protrusion 30.

The opening portion 34 is formed by dry etching under the condition in which the etching rate of the semiconductor layer 10 is higher than the etching rate of the buried insulating layer 12. Therefore, the protrusion 30 surrounded by the buried insulating layer 12 is etched faster than the buried insulating layer 12.

Therefore, the opening portion 34 is formed in a shape in which the second width w2' is larger than the first width w1'. In other words, the formation of the protrusion 30 makes it possible for the opening portion 34 surrounded by the buried insulating layer 12 to be self-aligned with the protrusion 30 and the gate electrode 16.

When the opening portion 34 is formed by dry etching, the semiconductor layer 10, the gate insulating film 14, and the polysilicon layer 16a are etched under a single etching condition.

Figure 2E:
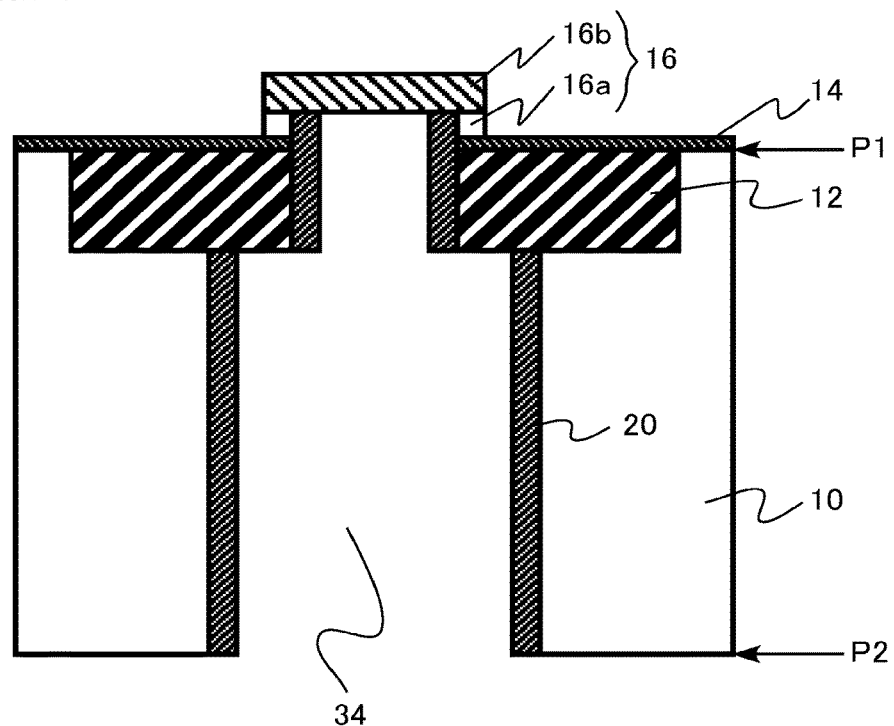

Then, the sidewall insulating film 20 is formed on the sidewall of the opening portion 34 by, for example, a known vapor deposition method and a known dry etching method (FIG. 2E).

Figure 2F:
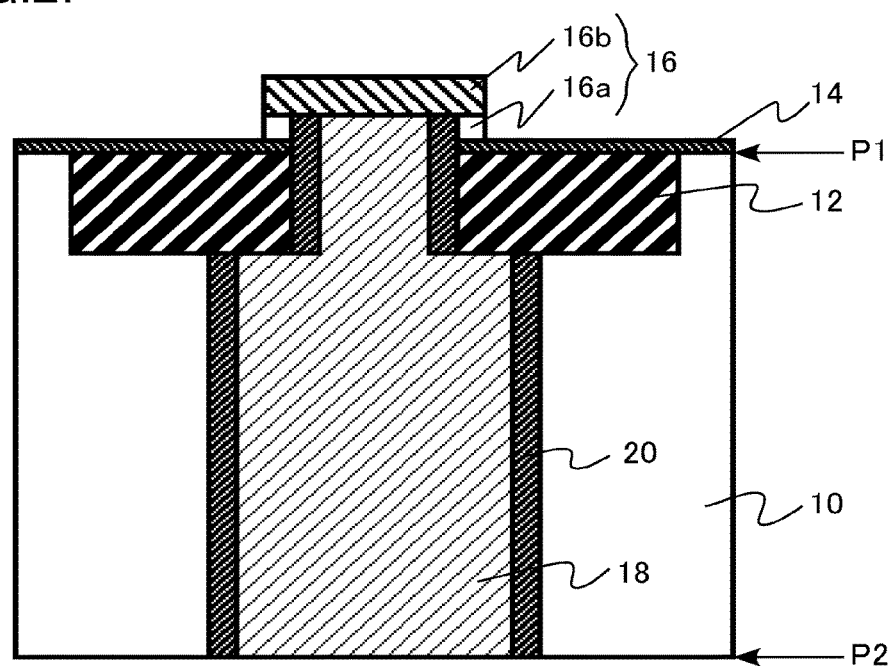

Then, the opening portion 34 is filled with metal by a known vapor deposition method and a known plating method to form the through electrode 18 (FIG. 2F). Then, the backside bump 22 is formed by a known manufacturing method. The semiconductor device according to the embodiment illustrated in FIGS. 1A and 1B is manufactured by the above-mentioned manufacturing method.

Next, the function and effect of the semiconductor device and the semiconductor device manufacturing method according to the embodiment will be described.

A TSV is used in order to electrically connect the semiconductor devices which are stacked. The use of the TSV makes it possible to reduce capacitance and resistance required to connect the semiconductor devices. Therefore, it is possible to reduce the power consumption of the stacked semiconductor devices and to improve an operation speed. Even if the TSV is used, it is necessary to further reduce the capacitance and resistance required to connect the semiconductor devices in order to further reduce power consumption and to further improve the operation speed.

FIGS. 3A and 3B are diagrams schematically illustrating a semiconductor device according to a comparative example. FIG. 3A is a cross-sectional view and FIG. 3B is a top view.

In the semiconductor device according to the comparative example, the width of a through electrode 18 in a first plane is defined as a first width (w4 in FIG. 3A), the width of the through electrode 18 in an intermediate plane is defined as a second width (w5 in FIG. 3A), and the width of a metal layer 16b is defined as a third width (w6 in FIG. 3A). The semiconductor device according to the comparative example differs from the semiconductor device according to the embodiment in that a first difference between the second width w5 and the first width w4 is equal to or less than a second difference between the third width w6 and the first width w4. In other words, in the semiconductor device according to the comparative example, w5−w4≤w6−w4 is satisfied.

In the semiconductor device according to the comparative example, the second width w5 is less than the third width w6.

In FIG. 3A, when the width of a gate electrode 16, that is, the third width w6 increases, the capacitance of the gate electrode 16 increases. When the capacitance of the gate electrode 16 connected to a TSV increases, the power consumption of the semiconductor devices which are stacked increases, which results in a reduction in the operation speed.

In the semiconductor device according to the embodiment illustrated in FIG. 1A, the width of the gate electrode 16, that is, the third width w3 is less than that in the semiconductor device according to the comparative example illustrated in FIG. 3A. Therefore, it is possible to reduce the power consumption of the semiconductor devices which are stacked and to improve the operation speed, as compared to the semiconductor device according to the comparative example.

In the semiconductor device according to the embodiment, the width of the through electrode 18 surrounded by the buried insulating layer 12 is less than the width of the through electrode 18 surrounded by the semiconductor layer 10 to reduce the width of the gate electrode 16. Specifically, when the width of the through electrode 18 in the first plane is the first width w1, the width of the through electrode 18 in the intermediate plane is the second width w2, and the width of the metal layer 16b is the third width w3, the first difference between the second width and the first width is larger than the second difference between the third width and the first width to reduce the width of the gate electrode 16.

It is preferable that the second width w2 be larger than the third width w3 in order to reduce the width of the gate electrode 16 and to reduce the capacitance of the gate.

The width of the through electrode 18 needs to be larger than a predetermined value in order to reduce resistance during connection using the TSV. In the semiconductor device according to the embodiment, the width of only a region of the through electrode 18 which is close to the gate electrode 16 is reduced. Therefore, an increase in the resistance of the entire through electrode 18 is prevented. Since the width of only a region of the through electrode 18 which is close to the gate electrode 16 is reduced, the width of the gate electrode 16 to which the through electrode 18 is connected is reduced.

Next, a method of manufacturing the semiconductor device according to the comparative example will be described. The method of manufacturing the semiconductor device according to the comparative example differs from the manufacturing method according to the embodiment in that the protrusion is not provided when the groove is formed in the first plane of the semiconductor layer. Hereinafter, the description of a portion of the same content as that in the manufacturing method according to the embodiment will not be repeated.

FIGS. 4A, 4B, 4C, and 4D are cross-sectional views schematically illustrating the semiconductor device which is being manufactured by the manufacturing method according to the comparative example.

First, a groove is formed in a first plane of a semiconductor layer 10 having the first plane and a second plane by, for example, a known lithography method and a known dry etching method. At that time, the protrusion according to the embodiment is not provided.

Figure 4A:
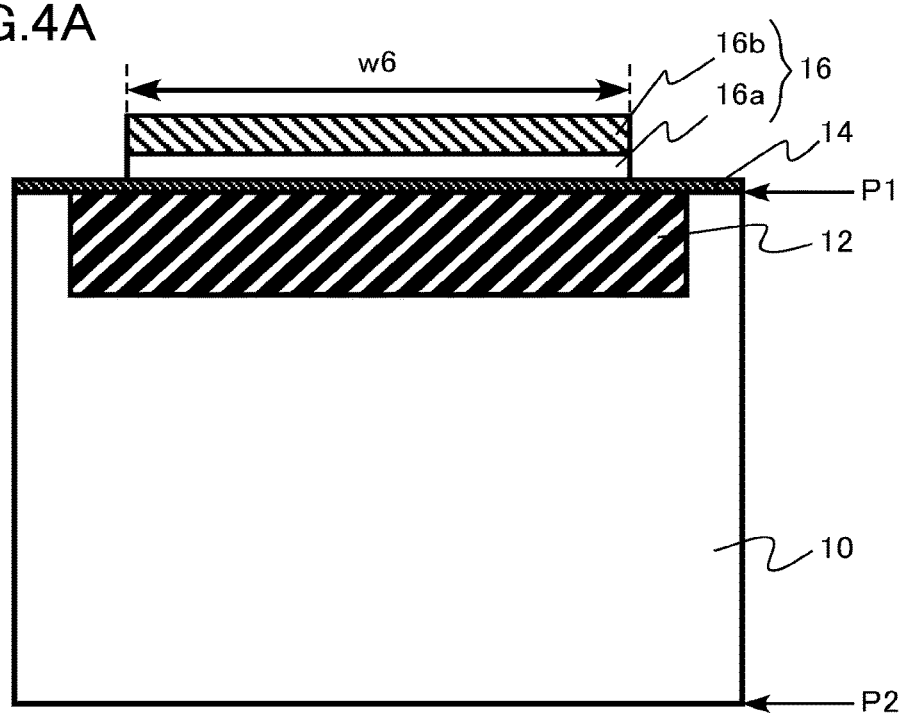

Then, the groove is filled with an insulating material to form a buried insulating layer 12. In addition, a gate insulating film 14 and a gate electrode 16 are formed (FIG. 4A).

When the pattern of the gate electrode 16 is formed by a lithography method, the pattern of the gate electrode 16 is matched with the pattern of the buried insulating layer 12 formed on the semiconductor layer 10.

Then, for example, a multi-layer wiring layer and a pad electrode (not illustrated) are formed on the gate electrode 16. Then, for example, backside polishing is performed for the second plane of the semiconductor layer 10 to reduce the thickness of the semiconductor layer 10.

Figure 4B:
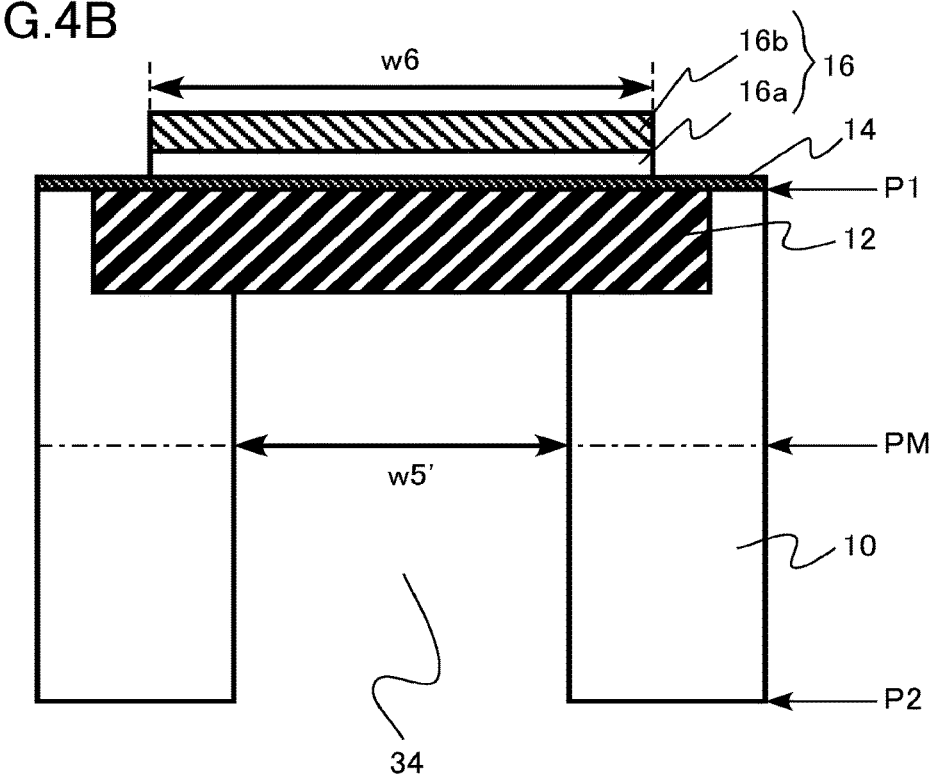

Then, an opening portion 34 is formed by, for example, a known lithography method and a known dry etching method (FIG. 4B). The dry etching method is, for example, an RIE method.

When the pattern of the opening portion 34 is formed by the lithography method, the pattern of the opening portion 34 is aligned with the pattern of the gate electrode 16.

First, the opening portion 34 is etched under a first condition in which the etching rate of the semiconductor layer 10 is higher than the etching rate of the buried insulating layer 12. The semiconductor layer 10 is etched under the first condition until the buried insulating layer 12 is exposed. At that time, the buried insulating layer 12 functions as an etching stopper.

Then, the etching condition is switched to a second condition in which the etching rate of the buried insulating layer 12 is higher than the etching rate of the semiconductor layer 10. Etching is performed under the second condition such that the opening portion 34 reaches the metal layer 16b through the buried insulating layer 12, the gate insulating film 14, and a polysilicon layer 16a (FIG. 4C). The metal layer 16b functions as an etching stopper.

The width of the opening portion 34 in the first plane is defined as a first width (w4' in FIG. 4C). The width of the opening portion 34 in the intermediate plane is defined as a second width (w5' in FIG. 4C). The first width w4' and second width w5' are equal to each other. The second width w5' is less than the width of the metal layer 16b (gate electrode 16), that is, a third width (w6 in FIG. 4C).

Then, a sidewall insulating film 20 is formed on a sidewall of the opening portion 34 (FIG. 4D).

Then, similarly to the embodiment, the opening portion 34 is filled with metal to form a through electrode 18. Then, a backside bump 22 is formed. The semiconductor device according to the comparative example illustrated in FIGS. 3A and 3B is manufactured by the above-mentioned manufacturing method.

In the manufacturing method according to the comparative example, the size of a portion of the metal layer 16b which comes into contact with the through electrode 18 depends on the accuracy of the size of the pattern of the opening portion 34 to be formed. In addition, the position of the portion of the metal layer 16b which comes into contact with the through electrode 18 depends on the accuracy of the alignment between the pattern of the gate electrode 16 and the pattern of the opening portion 34 when the opening portion 34 is formed by the lithography method. Etching for the thick semiconductor layer 10 causes a variation in the size of the opening portion 34.

In general, in lithography for the rear surface (second plane) of the semiconductor layer 10 as in the lithography for the opening portion 34 in the embodiment and the comparative example, the accuracy of the size of the pattern and the accuracy of the alignment between the patterns are lower than those in lithography for the front surface (first plane). This is caused by, for example, the accuracy of an exposure device or a resist process used in the lithography for the rear surface (second plane).

Therefore, in the manufacturing method according to the comparative example, it is necessary to ensure a sufficient alignment margin between the opening portion 34 and the gate electrode 16 in order to reliably bring the through electrode 18 into contact with the metal layer 16b. In other words, it is necessary to sufficiently increase the width of the gate electrode 16 with respect to the width of the opening portion 34.

As a result, as illustrated in FIGS. 3A and 3B, in the semiconductor device according to the comparative example, the first difference between the second width w5 and the first width w4 is equal to or less than the second difference between the third width w6 and the first width w4. In addition, the second width w5 is less than the third width w6.

According to the manufacturing method of the embodiment, the protrusion 30 surrounded by the buried insulating layer 12 is provided in a portion of the semiconductor layer 10 in which the opening portion 34 is formed (FIG. 2B). Therefore, for example, the size or position of a portion of the metal layer 16b which comes into contact with the through electrode 18 is determined by the protrusion 30 in a self-alignment manner with respect to the gate electrode 16.

The size or position of the portion of the metal layer 16b which comes into contact with the through electrode 18 is constantly maintained even if size of the pattern of the opening portion 34 varied or even if the positional deviation between the pattern of the opening portion 34 and the protrusion 30 occurs.

The pattern of the protrusion 30 is formed by lithography for the front surface (first plane) which can improve the accuracy of the size of the pattern and the accuracy of the alignment between the patterns.

As described above, a portion of the metal layer 16b which comes into contact with the through electrode 18 is formed by self-alignment with respect to the protrusion 30 and the gate electrode 16. Therefore, the alignment margin between the opening portion 34 and the gate electrode 16 is not required.

Therefore, in the manufacturing method according to the embodiment, the width of the gate electrode 16 can be designed independently of the formation of the opening portion 34. As a result, the width of the gate electrode 16 can be less than that in the comparative example.

That is, as illustrated in FIG. 1A, in the semiconductor device according to the embodiment, when the width of the through electrode 18 in the first plane is the first width (w1 in FIG. 1A), the width of the through electrode 18 in the intermediate plane is the second width (w2 in FIG. 1A), and the width of the metal layer 16b is the third width (w3 in FIG. 1A), the first difference between the second width w2 and the first width w1 can be larger than the second difference between the third width w3 and the first width w1.

In other words, the second difference, which is the alignment margin between the opening portion 34 and the gate electrode 16, can be less than the first difference. Therefore, the distance between the through electrode 18 and the end of the gate electrode 16 can be designed to be small and it is possible to reduce the width of the gate electrode 16.

The magnitude of the first difference is determined by the accuracy of the size of the pattern and the alignment accuracy of the pattern when the opening portion 34 is formed. The first difference is preferably equal to or larger than 1 µm and more preferably equal to or larger than 2 µm, considering, for example, the accuracy of an exposure device or a resist process used in lithography for the rear surface (second plane) and a variation in the size of the opening portion 34 due to etching for the thick semiconductor layer 10.

Figure 5A:
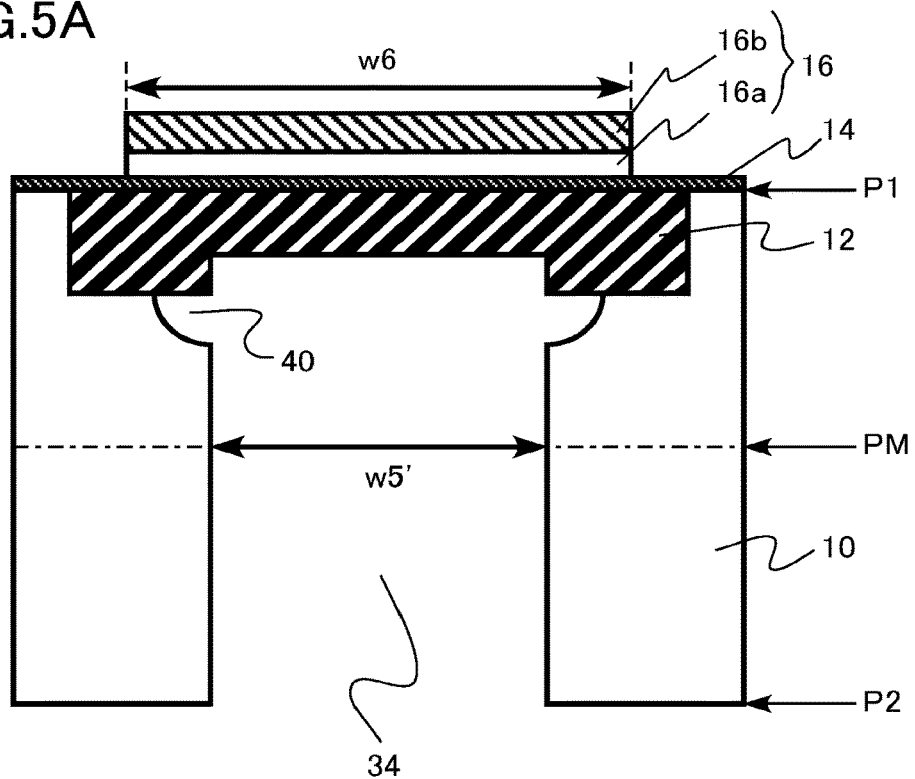
FIGS. 5A and 5B are diagrams illustrating the problems of the manufacturing method according to the comparative example.
Figure 5B:
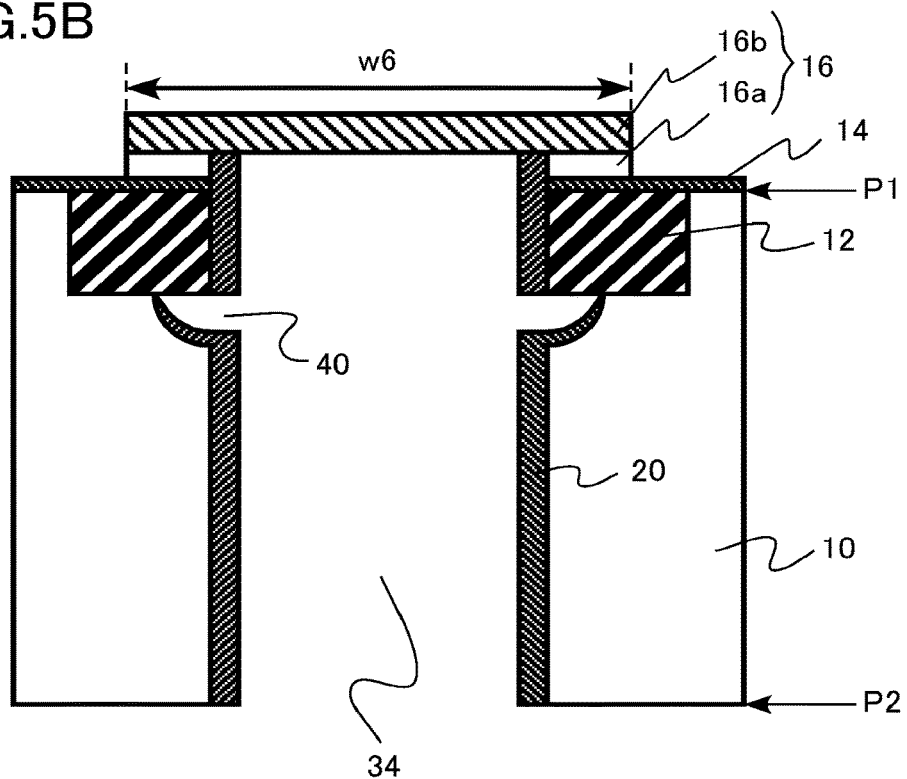

FIGS. 5A and 5B are diagrams illustrating the problems of the manufacturing method according to the comparative example.

In the manufacturing method according to the comparative example, when the opening portion 34 is formed, first, etching is performed until the buried insulating layer 12 is exposed. At that time, the first condition in which the etching rate of the semiconductor layer 10 is higher than the etching rate of the buried insulating layer 12 is applied. When the semiconductor layer 10 is etched under the first condition, the buried insulating layer 12 functions as an etching stopper.

After the buried insulating layer 12 is exposed, predetermined overetching is performed under the first condition, considering a variation in the thickness of the semiconductor layer 10 or the buried insulating layer 12. At that time, in some cases, notching (side etching) 40 occurs in the vicinity of the boundary between the opening portion 34, and the semiconductor layer 10 and the buried insulating layer 12 (FIG. 5A).

It is considered that, when overetching is performed during RIE, the buried insulating layer 12 is positively charged and the trajectory of ions is curved, which causes the notching 40.

When the notching 40 occurs, the coverage of the film in which the notching 40 occurs deteriorates during the formation of the sidewall insulating film 20. Therefore, the thickness of the sidewall insulating film 20 in which the notching 40 occurs is reduced (FIG. 5B).

In this state, when the through electrode 18 is formed, the insulation between the through electrode 18 and the semiconductor layer 10 degrades and a leakage current is generated. The leakage current between the through electrode 18 and the semiconductor layer 10 causes errors in the operation of the semiconductor device.

In the semiconductor device according to the embodiment, the protrusion 30 is provided on the semiconductor layer 10. Therefore, when the opening portion 34 is formed, the exposed area of the buried insulating layer 12 is less than that in the comparative example. When the semiconductor layer 10 is etched, the occurrence of notching is prevented. As a result, it is possible to reduce the amount of leakage current between the semiconductor layer 10 and the through electrode 18.

According to the semiconductor device and the semiconductor device manufacturing method according to the embodiment, it is possible to reduce the size of a portion of the gate electrode 16 to which the through electrode 18 is connected. Therefore, the capacitance of the gate electrode 16 is reduced. As a result, it is possible to reduce the power consumption of the stacked semiconductor devices and to improve the operation speed. In addition, according to the semiconductor device manufacturing method according to the embodiment, it is possible to reduce the amount of leakage current between the semiconductor layer 10 and the through electrode 18.

In the above-described embodiment, the non-volatile memory is given as an example of the semiconductor device. However, the invention can also be applied to other types of semiconductor devices.

In the above-described embodiment, the side of the through electrode 18 or the opening portion 34 is vertical or has a linear shape. However, the side of the through electrode 18 or the opening portion 34 may have other shapes, such as a forward tapered shape, a reverse tapered shape, and an arch shape.

In the above-described embodiment, the metal layer is the gate electrode. The metal layer may be used as a wiring layer other than the gate electrode. Alternatively, a metal layer only for forming the through electrode may be used.

While certain embodiments have been described, these embodiments have been presented by way of example only, and are not intended to limit the scope of the inventions. Indeed, semiconductor device and manufacturing method of the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    forming a groove and a protrusion having a first width in a first plane of a semiconductor layer having the first plane and a second plane;
    filling the groove with an insulating layer;
    forming a metal layer on the protrusion;
    forming an opening portion extending from the second plane to the metal layer through the semiconductor layer, the opening portion having a second width larger than the first width in an intermediate plane between the first plane and the second plane, the protrusion being removed during the forming of the opening portion; and
    filling the opening portion with metal to form a through electrode,
    wherein, in a view perpendicular to the first plane, the metal layer is positioned over the protrusion, a width of the metal layer is larger than the first width, and the width of the metal layer is smaller than the second width.

2. The method of manufacturing a semiconductor device according to claim 1, further comprising:
    forming an insulating film on a sidewall of the opening portion after the forming of the opening portion and before the filling of the opening portion with the metal.

3. The method of manufacturing a semiconductor device according to claim 1, wherein the semiconductor layer is made of silicon.

4. The method of manufacturing a semiconductor device according to claim 1, wherein the insulating layer is made of silicon oxide.

5. The method of manufacturing a semiconductor device according to claim 1, further comprising:
    forming a polysilicon layer between the metal layer and the protrusion.

6. The method of manufacturing a semiconductor device according to claim 1, wherein the opening portion is formed by dry etching.

7. The method of manufacturing a semiconductor device according to claim 1, wherein a thickness of the semiconductor layer is equal to or larger than 30 μm.

* * * * *